United States Patent
Lee et al.

(10) Patent No.: US 7,075,830 B2
(45) Date of Patent: Jul. 11, 2006

(54) METHOD FOR PROGRAMMING SINGLE-BIT STORAGE SONOS TYPE MEMORY

(75) Inventors: Tzyh-Cheang Lee, Hsin-Chu (TW); Chungchin Shih, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 100 days.

(21) Appl. No.: 10/709,666

(22) Filed: May 21, 2004

(65) Prior Publication Data

US 2005/0259474 A1    Nov. 24, 2005

(51) Int. Cl.
*G11C 16/04* (2006.01)

(52) U.S. Cl. .......................... 365/185.28; 365/185.18; 365/185.01

(58) Field of Classification Search ............. None
See application file for complete search history.

(56) References Cited

U.S. PATENT DOCUMENTS 6,754,109 B1* 6/2004 Fastow et al. ......... 365/185.28

* cited by examiner

*Primary Examiner*—David Lam
(74) *Attorney, Agent, or Firm*—Winston Hsu

(57) ABSTRACT

A method for programming a single-bit storage nonvolatile memory cell includes the steps of: providing a single-bit storage nonvolatile memory cell having a channel region between a left bit line and a right bit line, a composite dielectric layer for storing digital data, and a word line overlying the composite dielectric layer, performing a left side electron injection on the single-bit storage nonvolatile memory cell by applying a relatively high word line voltage to the word line, applying a relatively high left bit line voltage to the left bit line, and applying a relatively low right bit line voltage to the right bit line; and performing a right side electron injection by applying the relatively high word line voltage to the word line, applying a relatively low left bit line voltage to the left bit line, and applying a relatively high right bit line voltage to the right bit line.

6 Claims, 3 Drawing Sheets

METHOD FOR PROGRAMMING SINGLE-BIT STORAGE SONOS TYPE MEMORY

BACKGROUND OF INVENTION

1. Field of the Invention

The present invention relates generally to the field of electrically erasable programmable non-volatile memory devices. More particularly, the present invention relates to a method for programming one-bit-per-cell or single-bit storage SONOS type memory cells.

2. Description of the Prior Art

Nitride-based non-volatile memories such as Nitride Read-Only-Memory (NROM), Metal-Oxide-Nitride-Oxide-Silicon (MONOS) type or Silicon-Oxide-Nitride-Oxide-Silicon (SONOS) type non-volatile memory devices, which have traditionally been used to store a single digital bit per memory cell (hereinafter referred to as single-bit storage), are known in the art. Generally, a nitride-based non-volatile memory cell is constructed having a non-conducting dielectric layer, typically a silicon nitride layer, sandwiched between two silicon dioxide layers. The non-conducting dielectric layer functions as an electrical charge-trapping medium. A conductive gate layer is placed over the upper silicon dioxide layer. Buried doping regions or buried bit lines are implanted into the substrate, which function as a buried drain or buried source for a selected memory cell. For single-bit storage SONOS type non-volatile memory, the electrical charge is trapped and localized near a side that is used as the buried drain.

FIG. 1 schematically illustrates an enlarged cross-sectional view of a prior art single-bit storage SONOS type memory cell 100. Typically, single-bit storage SONOS type memory cell 100 is programmed by injecting hot electrons from a portion of the substrate 10, such as the channel section 16 near the buried drain region 12, to the charge-trapping medium 24. Electron injection causes the accumulation of negative charge in the charge-trapping medium 24 that is sandwiched between the bottom oxide layer 22 and the top oxide layer 26. The injection mechanism can be induced by grounding the buried source region 14 and a bulk portion of the substrate 10 and applying a relatively high positive voltage to the control electrode 30 to create an electron attracting field and applying a positive high voltage to the buried drain region 12 in order to generate hot electrons. After sufficient negative charge accumulates on the charge-trapping medium, the negative potential of the charge-trapping medium raises the threshold voltage of its field effect transistor (FET) and inhibits current flow through the channel region through a subsequent read mode. The magnitude of the read current is used to determine whether or not a SONOS type memory cell is programmed. The single-bit storage SONOS type memory cell 100 is typically erased by Fowler-Nordheim (FN) tunneling hot hole injection.

However, the above-described prior art method for programming the single-bit storage SONOS type memory cell 100 has at least one drawback. Since the injected electrons are localized near the drain side, the distribution of the trapped electrons within the charge-trapping medium 24 is therefore asymmetric and non-uniform across the channel region 16 between the source side and drain side of the memory cell 100. The asymmetric electron distribution profile 60 as specifically depicted in an upper portion of FIG. 1 leads to inadequate erasure and thus causes significant threshold voltage ($V_t$) increase. Accordingly, there is a need to provide an improved programming method to solve this problem.

SUMMARY OF INVENTION

It is the primary object of the present invention to provide an improved method for programming an electrically erasable programmable nonvolatile single-bit storage memory.

It is another object of the present invention to provide an improved method for programming a single-bit storage SONOS type memory cell, thereby mitigating $V_t$ increase of the single-bit storage SONOS type memory cell.

According to the claimed invention, a method for programming a single-bit storage nonvolatile memory cell includes the steps of: providing a single-bit storage nonvolatile memory cell having a channel region between a left bit line and a right bit line, a composite dielectric layer for storing digital data, and a word line overlying the composite dielectric layer; performing a left side electron injection on the single-bit storage nonvolatile memory cell by applying a relatively high word line voltage ($V_{WL,\ HIGH}$) to the word line, applying a relatively high left bit line voltage ($V_{LBL,\ HIGH}$) to the left bit line, and applying a relatively low right bit line voltage ($V_{RBL,\ LOW}$) to the right bit line; and performing a right side electron injection on the single-bit storage nonvolatile memory cell by applying the relatively high word line voltage ($V_{WL,\ HIGH}$) to the word line, applying a relatively low left bit line voltage ($V_{LBL,\ LOW}$) to the left bit line, and applying a relatively high right bit line voltage ($V_{RBL,\ HIGH}$) to the right bit line.

Other objects, advantages and novel features of the invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention pertains to an improved method for programming a single-bit storage SONOS type nonvolatile memory cell. It is to be understood that a SONOS type nonvolatile memory device as cited herein may contain any of the charge-trapping dielectrics known in the art, although the term SONOS type nonvolatile memory device is often used herein. In other words, a SONOS type nonvolatile memory device contains any dielectric layer or layers that are capable of or facilitate electron trapping, and the SONOS type nonvolatile memory device contains an oxide-nitride-oxide (ONO) charge trapping tri-layer dielectric only when a specific reference to such dielectric is indicated.

Figure 1:
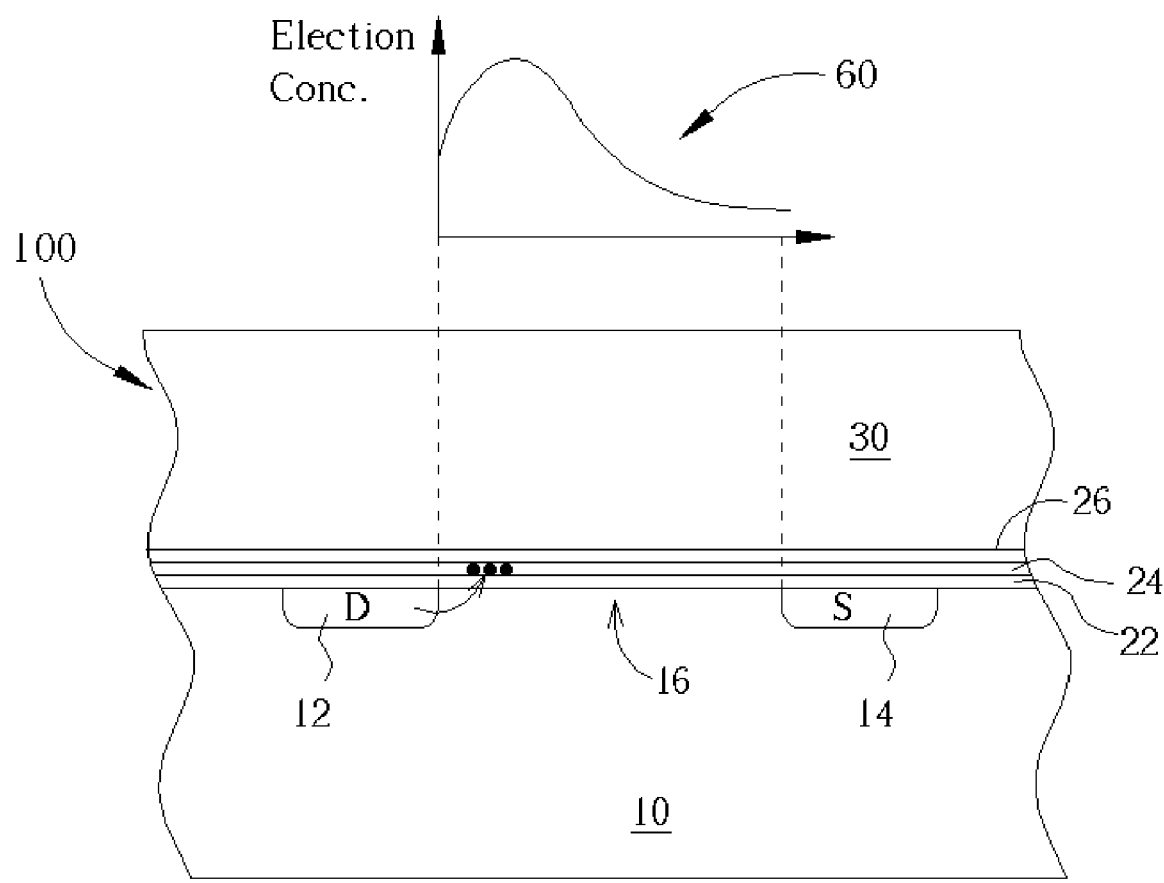
FIG. 1 is a schematic, cross-sectional diagram illustrating a single-bit storage SONOS type memory cell according to the prior art, wherein an asymmetric electron distribution profile is schematically plotted at an upper portion thereof.
Figure 2:
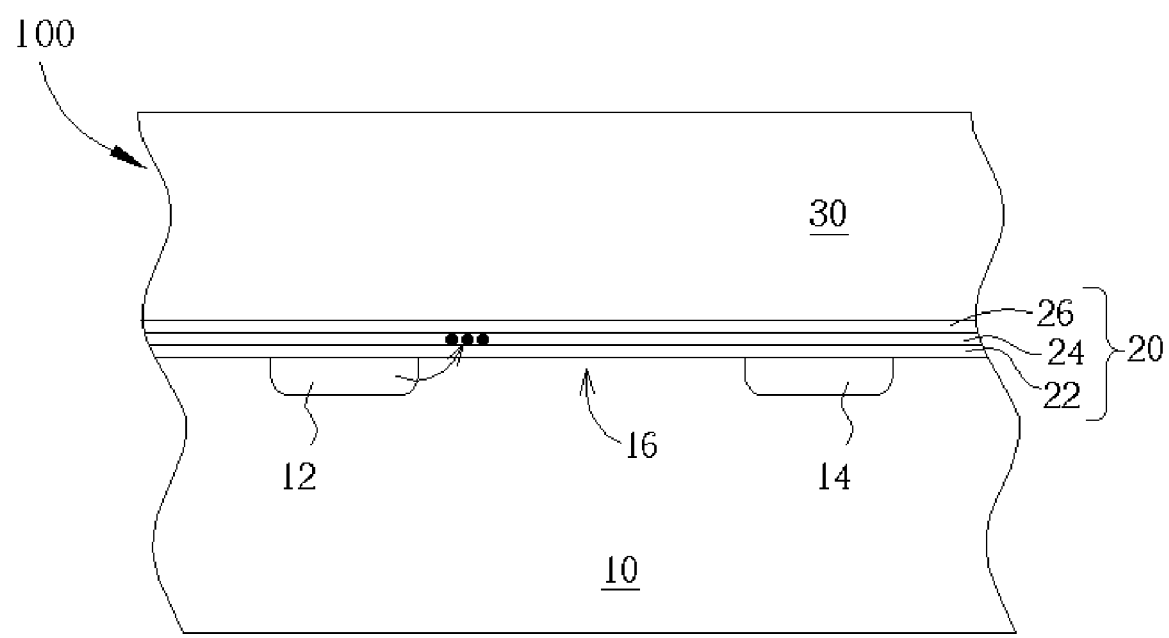
FIG. 2 and FIG. 3 are schematic cross-sectional diagrams illustrating a method for programming a single-bit storage SONOS type memory cell in accordance with the preferred embodiment of the present invention, wherein an improved electron distribution profile is schematically plotted at an upper portion of FIG. 3.
Figure 3:
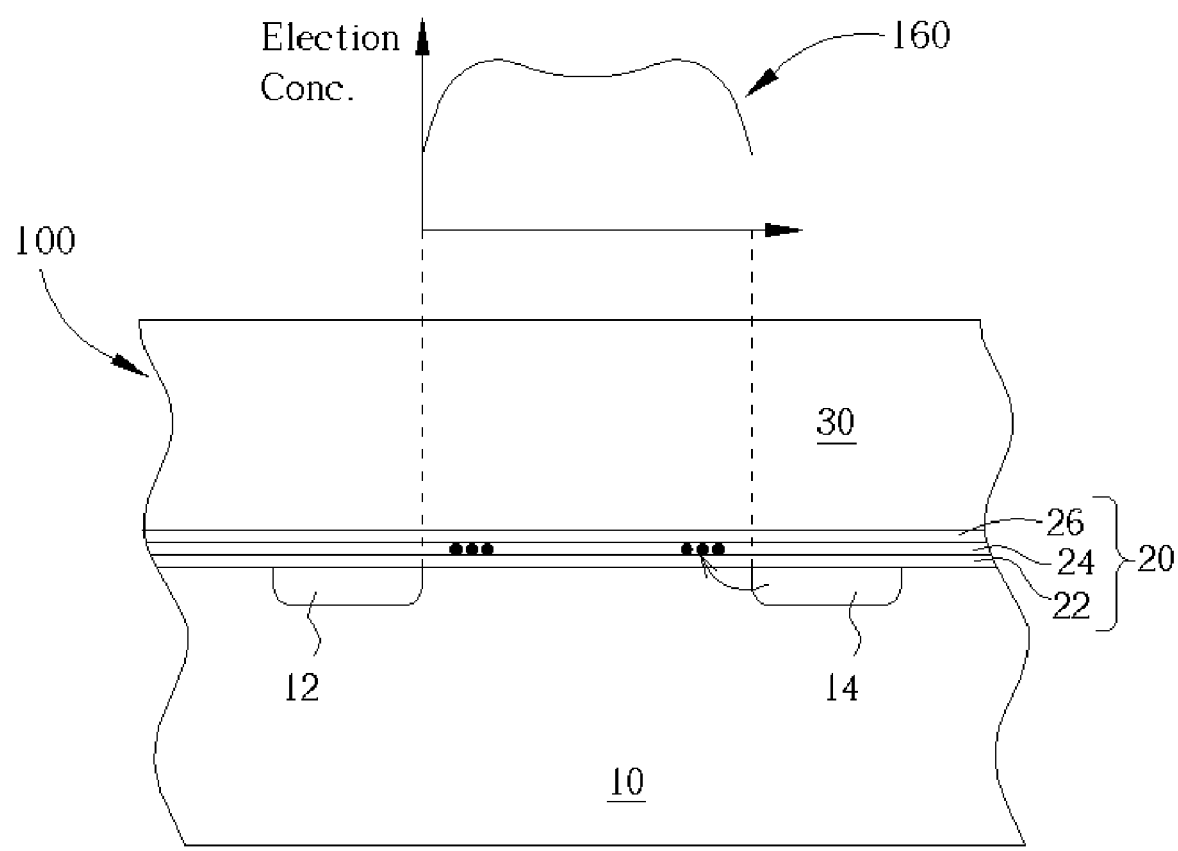

Please refer to FIG. 2 and FIG. 3. FIG. 2 and FIG. 3 are schematic cross-sectional diagrams illustrating a method for programming a single-bit storage SONOS type memory cell in accordance with the preferred embodiment of the present invention, wherein like numerals designate similar regions, elements, or layers. As shown in FIG. 2, a substrate 10 of first conductivity type such as P type substrate is prepared. The substrate 10 has a main surface on which memory array and memory cells are fabricated. It is appreciated by those skilled in the art that the numeral 10 may alternatively indicate a cell ion well such as a P well that is doped in a bulk silicon substrate. Further, it is to be understood that only a segment of the memory array that is germane to the present invention is illustrated in this figure.

Columns of buried bit lines 12 and 14 are formed in the substrate 10. A composite dielectric layer 20 is formed on the channel regions 16. One row of polysilicon word line 30 overlies the composite dielectric layer 20. The word line 30 is orthogonal to the buried bit lines 12 and 14. In other embodiments, the polysilicon word line 30 may be replaced with other conductive materials such as metals. The single-bit storage SONOS type memory cell 100 of this invention includes a channel region 16 between a left bit line 12 and a right bit line 14, a composite dielectric layer 20 for storing digital data, and a word line 30.

The composite dielectric layer 20 may be any dielectric layer or layers that are capable of or facilitate electron trapping. In other words, to facilitate electron trapping, the charge trapping dielectric has a layer with a lower barrier height than the layers sandwiching it (two layers with relatively higher barrier heights sandwiching a layer with a relatively lower barrier height). Preferably, in accordance with the preferred embodiment of the present invention, the composite dielectric layer 20 is an ONO tri-layer dielectric including a bottom silicon oxide layer 22, a middle silicon nitride layer 24, and a top silicon oxide layer 26. Other examples of the composite dielectric layer 20 include an oxide/nitride bi-layer dielectric, a nitride/oxide bi-layer dielectric, an oxide/tantalum oxide bi-layer dielectric ($SiO_2$/$Ta_2O_5$), an oxide/tantalum oxide/oxide tri-layer dielectric ($SiO_2$/$Ta_2O_5$/$SiO_2$), an oxide/strontium titanate bi-layer dielectric ($SiO_2$/$SrTiO_3$), an oxide/barium strontium titanate bi-layer dielectric ($SiO_2$/$BaSrTiO_2$), an oxide/strontium titanate/oxide tri-layer dielectric ($SiO_2$/$SrTiO_3$/$SiO_2$), an oxide/strontium titanate/barium strontium titanate tri-layer dielectric ($SiO_2$/$SrTiO_3$/$BaSrTiO_2$), an oxide/hafnium oxide/oxide tri-layer dielectric($SiO_2$/$Hf_2O_5$/$SiO_2$), and the like (in each case, the first layer mentioned is the bottom layer while the last layer mentioned is the top layer).

Stilling referring to FIG. 2, in accordance with the present invention method, when programming the single-bit storage SONOS memory cell 100, a relatively high word line voltage ($V_{WL, HIGH}$) is applied to the selected word line 30, a relatively high left bit line voltage ($V_{LBL, HIGH}$) is applied to the left bit line 12, a relatively low right bit line voltage ($V_{RBL, LOW}$) is applied to the right bit line 14, and a relatively low substrate voltage ($V_{SUB}$) is applied to the substrate 10. Under the above-described programming conditions, a left-side hot electron injection is carried out to inject electrons into the nitride layer 24, which are trapped and localized near the left bit line 12.

Subsequently, as shown in FIG. 3, a secondary program operation is carried out on the memory cell 100. To obtain a uniform distribution of the trapped electrons within the charge-trapping layer 24 across the channel region 16 between the left bit line 12 and right bit line 14 of the memory cell 100, a right-side hot electron injection is induced to inject electrons into the nitride layer 24, which are trapped and localized near the right bit line 12. In accordance with the present invention method, when secondarily programming the single-bit storage SONOS memory cell 100, a relatively high word line voltage ($V_{WL, HIGH}$) is applied to the selected word line 30, a relatively low left bit line voltage ($V_{LBL, LOW}$) is applied to the left bit line 12, a relatively high right bit line voltage ($V_{RBL, HIGH}$) is applied to the right bit line 14, and a relatively low substrate voltage ($V_{SUB}$) is applied to the substrate 10.

By secondarily programming the single-bit storage SONOS memory cell 100 from a right side of the cell, a substantially symmetric and uniform distribution of the trapped electrons within the charge-trapping layer 24 across the channel region 16 can be obtained. The improved electron distribution profile 160 is schematically plotted at an upper portion of FIG. 3.

Those skilled in the art will readily observe that numerous modification and alterations of the present invention may be made while retaining the teachings of the invention. Accordingly, the above disclosure should be construed as limited only by the metes and bounds of the appended claims.

What is claimed is:

1. A method for programming a single-bit storage SONOS memory cell, wherein said single-bit storage SONOS memory cell comprises a channel region between a left bit line and a right bit line, a composite dielectric layer for storing digital data, and a word line overlying said composite dielectric layer, the method comprising:

performing a left side electron injection on said single-bit storage SONOS memory cell by applying a relatively high word line voltage ($V_{WL, HIGH}$) to said word line, applying a relatively high left bit line voltage ($V_{LBL, HIGH}$) to said left bit line, and applying a relatively low right bit line voltage ($V_{RBL, LOW}$) to said right bit line; and performing a right side electron injection on said single-bit storage SONOS memory cell by applying said relatively high word line voltage ($V_{WL, HIGH}$) to said word line, applying a relatively low left bit line voltage ($V_{LBL, LOW}$) to said left bit line, and applying a relatively high right bit line voltage ($V_{RBL, HIGH}$) to said right bit line.

2. The method according to claim 1 wherein said composite dielectric layer is an ONO tri-layer dielectric including a bottom silicon oxide layer, a middle silicon nitride layer, and a top silicon oxide layer.

3. The method according to claim 1 wherein said left bit line and said right bit line are both buried bit lines that are implanted into a substrate.

4. A method for programming a single-bit storage nonvolatile memory cell, comprising:

providing a single-bit storage nonvolatile memory cell comprising a channel region between a left bit line and a right bit line, a composite dielectric layer for storing digital data, and a word line overlying said composite dielectric layer;

performing a left side electron injection on said single-bit storage nonvolatile memory cell by applying a relatively high word line voltage ($V_{WL, HIGH}$) to said word line, applying a relatively high left bit line voltage ($V_{LBL\ HIGH}$) to said left bit line, and applying a relatively low right bit line voltage ($V_{RBL,\ LOW}$) to said right bit line; and performing a right side electron injection on said single-bit storage nonvolatile memory cell by applying said relatively high word line voltage ($V_{WL,\ HIGH}$) to said word line, applying a relatively low left bit line voltage ($V_{LBL,\ LOW}$) to said left bit line, and applying a relatively high right bit line voltage ($V_{RBL\ HIGH}$) to said right bit line.

5. The method according to claim 4 wherein said single-bit storage nonvolatile memory cell is a single-bit storage SONOS memory cell.

6. The method according to claim 4 wherein said composite dielectric layer is an ONO tri-layer dielectric including a bottom silicon oxide layer, a middle silicon nitride layer, and a top silicon oxide layer.

* * * * *